(12) United States Patent
Gambino et al.

(10) Patent No.: US 6,361,863 B1
(45) Date of Patent: Mar. 26, 2002

(54) DEVICE HAVING MAGNETORESISTIVE MATERIAL

(75) Inventors: Richard J. Gambino, Stony Brook; Dongil Shin, Selden, both of NY (US)

(73) Assignee: The Research Foundation of State University of New York, Stony Brook, NY (US)

( * ) Notice: Subject to any disclaimer, the term of this patent is extended or adjusted under 35 U.S.C. 154(b) by 0 days.

(21) Appl. No.: 09/313,235

(22) Filed: May 17, 1999

(51) Int. Cl.$^7$ ................................................ G11B 5/66
(52) U.S. Cl. .................. 428/402; 428/403; 428/404; 428/900; 360/113; 328/32 R; 324/252; 252/62.51; 427/127; 427/128; 427/129; 427/130
(58) Field of Search ................. 428/694 R, 694 T, 428/692, 402, 403, 404, 900; 360/113; 328/32 R; 252/62.51; 324/252; 427/127, 128, 129, 130

(56) References Cited

U.S. PATENT DOCUMENTS 5,856,008 A * 1/1999 Cheong ....................... 428/402

OTHER PUBLICATIONS

Xiao, et al. "Giant Magnetoresistance. . . " Physical Review Letters Jun. 22, 1992.*
Inoue et al. "Theory of tunneling . . . " Physical Review B May 1, 1996.*
Inoue et al., "Theory of tunneling magnetoresistance in granular magnetic films," *Physical Review B*, vol. 53, No. 18, pp. R11 927–R11 929 (May 1, 1996).
Miyazaki et al., "Spin polarized in ferromagnet/insulator/ferromagnet junctions," *Journal of Magnetism and Magnetic Materials*, vol. 151, pp. 403–410 (1995).
Daughton et al., "Magnetic Field Sensors Using GMR Multilayer," *IEEE Transactions on Magnetics*, vol. 30, No. 6, pp. 4608–4610 (Nov., 1994).
Hylton et al., "Giant Magnetoresistance at Low Fields in Discontinuous NiFe–Ag Multilayer Thin Films", *Science*, vol. 261, pp. 1021–1024 (Aug., 1993).
Ranmuthu et al., "New Low Current Memory Modes with Giant Magneto–Resistance Materials," *IEEE Transactions on Magnetics*, vol. 29, No. 6 (Nov., 1993).
Zhang, "Theory of giant magnetoresistance in magnetic granular films," *Appl. Phys. Lett.*, vol. 61, No. 15, pp. 1855–1857 (Oct., 1992).
Berkowitz et al., "Giant Magnetoresistance in Heterogeneous Cu–Co Alloys," *Physical Review Letters*, vol. 68, No. 25, pp. 3745–3748 (Jun., 1992).
Xiao et al., "Giant Magnetoresistance in Nonmultilayer Magnetic Systems", *Physical Review Letters*, vol. 68, No. 25, pp. 3749–3752 (Jun., 1992).
Parkin, "Oscillations in giant magnetoresistance and antiferromagnetic coupling in [$Ni_{81}Fe_{19}/Cu$]$_N$ multilayers," *Appl. Phys. Lett.* vol. 60, No. 4, pp. 512–514 (Jan., 1992).
Daughton et al., "Giant Magnetoresistance in Narrow Stripes", *IEEE Transactions on Magnetics*, vol. 28, No. 5, pp. 2488–2493 (Sep., 1992).

(List continued on next page.)

*Primary Examiner*—Leszek Kiliman
(74) *Attorney, Agent, or Firm*—Baker Botts LLP

(57) ABSTRACT

A device comprising a magnetoresistive material including a mixture of powdered $CrO_2$ having granules at least partially coated with $Cr_2O_3$, and powdered Ni, the mixture being compressed to form a compacted material which exhibits a magnetoresistance ratio of at least 12% at 300° K and 4000 Oe.

35 Claims, 3 Drawing Sheets

OTHER PUBLICATIONS

Nakatani et al. "Giant Magnetoresistance in Ni–Fe/Cu Multilayers Formed by Ion Beam Sputtering," *IEEE Transactions on Magnetics*, vol. 28, No. 5, pp. 2668–2670 (Sep., 1992).

White, "Giant Magnetoresistance: A Primer," *IEEE Transactions on Magnetics*, vol. 28, No. 5, pp. 2482–2487 (Sep., 1992).

Pratt et al., "Perpendicular Giant Magnetoresistances of Ag/Co Multilayers," *Physical Review Letters*, vol. 66, No. 23, pp. 3060–3063 (Jun., 1991).

Dieny et al., "Giant magnetoresistance in soft ferromagnetic multilayers", *Physical Review B*, vol. 43, No. 1, pp. 1297–1300 (Jan., 1991).

Mosca et al., "Oscillatory interlayer coupling and giant magnetoresistance in Co/Cu multilayers", *Journal of Magnetism and Magnetic Materials*, vol. 94, pp. L1–L5 (1991).

Chang, "Magnetization of (100) Cu–Ni, (100)Cu–Co, and (100)Ni–Co superlattices deposited on silicon using a Cu seed layer", *Appl. Phys. Lett.* vol. 57, No. 3, pp. 297–299 (Jul., 1990).

Parkin et al., "Oscillations in Exchange Coupling and Magnetoresistance in Metallic Superlattice Structures; Co/Ru, Co/Cr, and Fe/Cr", *Physical Review Letters*, vol. 64, No. 19, pp. 2304–2307 (May, 1990).

Julliere, "Tunneling Between Ferromagenetic Films", *Physics Letters*, vol. 54A, No. 3, pp. 225–226 (Sep., 1975).

* cited by examiner

DEVICE HAVING MAGNETORESISTIVE MATERIAL

BACKGROUND OF INVENTION

The present invention relates to devices having magnetoresistive material and, more particularly to devices having magnetoresistive material comprising two-phase metallic ferromagnetic components which exhibit the giant magnetoresistance (GMR) effect.

A typical measure of magnetoresistance is given by $$\Delta\rho/\rho = (\rho_0 - \rho_{H\,sat})/\rho_{Hsat},$$

where $\rho_{Hsat}$ is the resistivity of the material when the applied magnetic field is at the saturation value $H_{sat}$ and $\rho_0$ is the resistivity of the material when the applied magnetic field is 0. The GMR effect, where the magnetoresistance ratio, $\Delta\rho/\rho$, is greater than a fraction of a percent, was first discovered in multilayered thin film structures and subsequently in metallic films containing magnetic particles (magnetic granular films). More recently, large $\Delta\rho/\rho$ has been observed in a device called a magnetic tunnel junction (MTJ), in which two ferromagnetic electrodes are separated by an insulating layer that is thin enough to permit quantum mechanical tunneling between the two electrodes. The tunneling phenomenon is electron-spin dependent, making the magnetic response of the MTJ a function of the relative orientations of the spin polarizations of the two electrodes. Although thin film GMR and MTJ devices are useful for sensing magnetic field and other applications involving small scales, such as sensing magnetically stored information in a computer disk memory, they are not suited to large scale applications such as in anti-lock braking systems for vehicles and rotary machine feedback systems, which require bulk quantities, sheets or thick films of magnetoresistive material. Moreover, such large scale applications typically require the device to operate at normal ambient temperatures, such as room temperature (300° K).

U.S. Pat. No. 5,856,008 to Cheong et al. describes forming a magnetoresistive material consisting of compacted $CrO_2$ powder with the grains of the powder at least partially coated with a thin layer of insulating $Cr_2O_3$. Although the Cheong et al. patent describes this material as having a magnetoresistance ratio of greater than 12%, such a high magnetoresistance ratio was achieved only at a cryogenic temperature of 5° K and a relatively high magnetic field of 20,000 Oe. The data contained in the Cheong et al. patent shows that the material has a magnetoresistance ratio of 0.2% at 200° K and 1000 Oe, and there is no data in the patent showing that the material has any GMR effect at normal ambient temperatures, such as room temperature (300° K).

The Cheong et al. patent provides an explanation for the desirable magnetoresistance ratio as being attributable to spin-polarlized tunneling between grains, with the insulating material, i.e., $Cr_3O_2$, enhancing the spin-polarization effect, and cites the references J. Inoue et al., "Theory of Tunneling Magnetoresistance in Granular Magnetic Films," Physical Review B., Vol. 53, No. 16, at 927, and Miyazaki et al., "Spin Polarized Tunneling in Ferro Magnet/Insulator/Ferro Magnet Junctions," Journal of Magnetism and Magnetic Materials," 151, at 403 in support of the explanation. However, the GMR effect in the Cheong et al. material can only be obtained at cryogenic temperatures which makes it unsuitable for the large scaled applications, such as the ones mentioned above.

Accordingly, what is needed is a GMR material which can be made in bulk and which exhibits a high magnetoresistance ratio at normal ambient temperatures, e.g., room temperature.

SUMMARY OF THE INVENTION

The invention provides a device comprising a magnetoresistive material that includes a first metallic ferromagnetic powder material at least partially coated with a thin insulating material and a second metallic ferromagnetic material in contact with the granules of the first metallic ferromagnetic powder material, the granules of the first ferromagnetic powder material having a higher coercive field than the second ferromagnetic material. According to an exemplary embodiment of the present invention, the granules of the first metallic ferromagnetic material are relatively hard, and the second metallic ferromagnetic material is also in powder form having granules which are relatively soft, the first and second metallic ferromagnetic powder materials being mixed and compressed to form a compacted mixture. According to a still further exemplary embodiment of the present invention, the first metallic ferromagnetic powder material has $CrO_2$ granules at least partially coated with a thin layer of $Cr_2O_3$, and the second metallic ferromagnetic powder material has Ni granules.

Another aspect of the present invention is a method for making a device comprising a magnetoresistive material including the steps of mixing a first metallic ferromagnetic powder material having relatively hard granules at least partially coated with a thin insulating material, and a second metallic ferromagnetic powder material having relatively soft granules, the granules of the first ferromagnetic powder material having a higher coercive field than the granules of the second ferromagnetic powder material, and compressing, rolling or extruding the mixture to form a compacted magnetoresistive material. The magnetoresistive material in the device of the invention typically exhibits a magnetoresistance ratio of 8% at room temperature (i.e., 300° K) in a magnetic field of about 4000 Oe applied substantially perpendicular to the direction of current flow in the material and a magnetoresistance ratio of 12% under the same conditions except that the direction of the applied magnetic field is parallel to the direction of current flow in the material.

BRIEF DESCRIPTION OF THE DRAWINGS

For a more complete understanding of the nature and benefits of the present invention, reference should be made to the following detailed description taken in conjunction with the accompanying drawings, in which.

DETAILED DESCRIPTION

Figure 1:
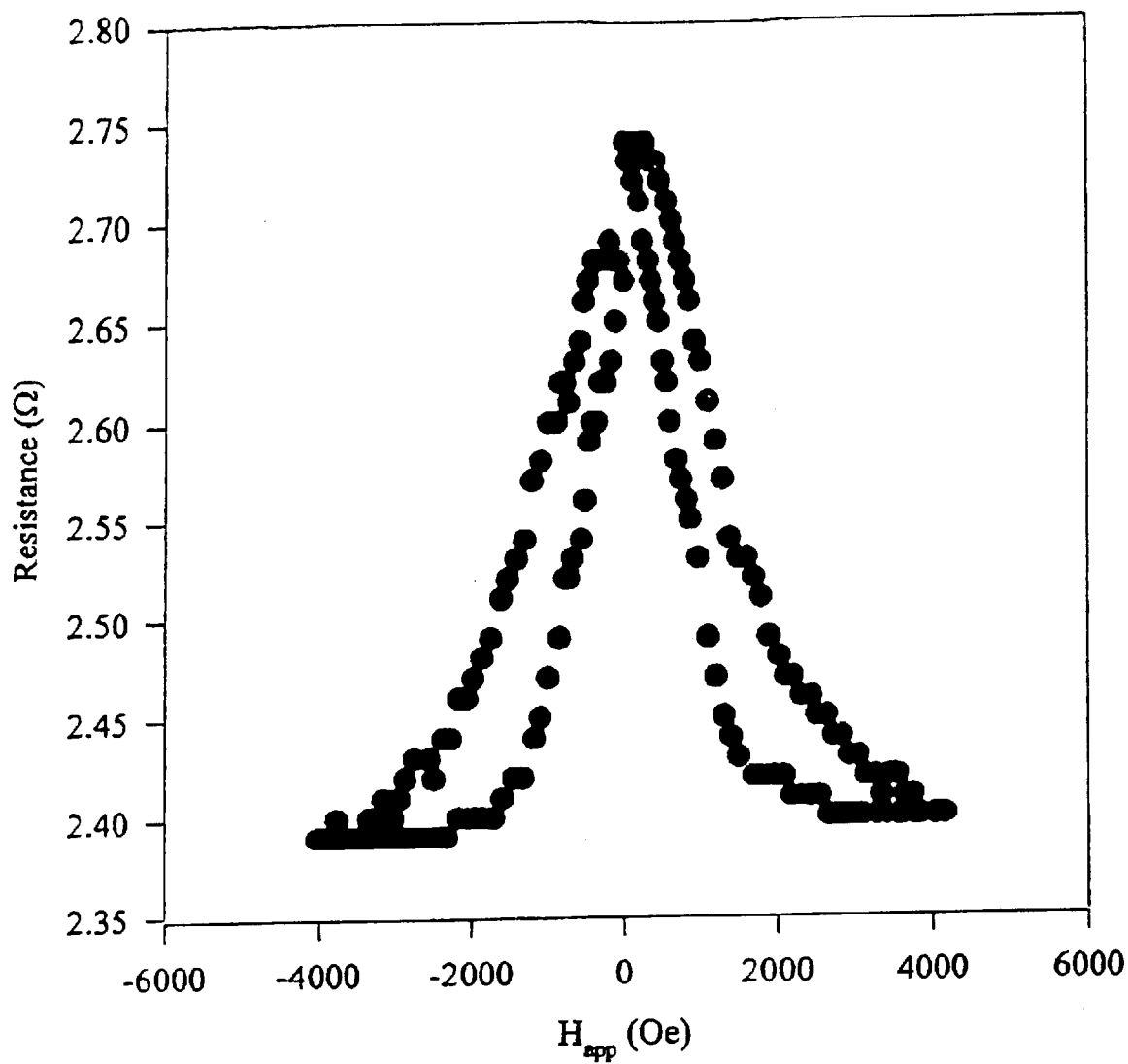
FIG. 1 is a graph of the sample resistance versus applied magnetic field, $H_{app}$, for a sample current of 0.1 mA, where the applied field is substantially parallel to the direction of current flow in the sample made in accordance with the exemplary embodiment of the invention.

In accordance with the present invention, Ni powder and $CrO_2$ powder are mixed together and compacted by pressing, rolling or extruding to form a material that exhibits GMR at room temperature. Nickel is a ductile ferromagnetic metal with a relatively low coercivity and $CrO_2$ is a metallic ferromagnet with a higher coercivity than Ni. Chromium dioxide is also relatively hard and forms an insulating coating of $Cr_2O_3$ by loss of oxygen from the surface of the granules in the $CrO_2$ powder. When the Ni and the $CrO_2$ powders are mixed and pressed to form a compact, the relatively soft Ni granules deform and make intimate contact with the $CrO_2$ granules without rupturing the thin insulating coated of $Cr_2O_3$ on the surfaces of the hard $CrO_2$ granules. Having an intact insulating tunnel barrier layer on the surfaces of the $CrO_2$ granules allows the Ni/$CrO_2$ powder mixture to exhibit GMR at room temperature. On the other hand, having a defective insulating tunnel barrier on the $CrO_2$ granules will still allow the material to exhibit GMR at cryogenic temperatures but will exhibit no GMR at room temperature.

In order to have a large tunneling magnetoresistance, it is also necessary that the two magnetic metal species in the mixture have different orientations of their magnetization vectors in the low field (i.e., high resistance) state and have parallel magnetization vectors in the high field (i.e., low resistance) state. In the pure $CrO_2$ powder system, differences from grain to grain in the magnetocrystalline easy axis and shape anisotropy provide some difference in orientation. The anisotropy increases at lower temperatures so that the magnetoresistance effect is larger at low temperatures. In the Ni/$CrO_2$ mixtures of the present invention, the two magnetic phases have very different coercive fields so that the Ni magnetization aligns in a relatively low field and the $CrO_2$ magnetization aligns at a higher field. The high resistance state occurs at a field that is intermediate between the coercive field of the Ni and that of the $CrO_2$, a lower field than required in the pure $CrO_2$ material.

It is contemplated that other mixtures may be used to achieve GMR at room temperature in accordance with the present invention. A powder of a Co—Zr alloy when exposed to an oxidizing gas, e.g., air, at about 100° C. forms a thin insulating coating of $ZrO_2$ that can act as a tunneling barrier. The zirconium in the alloy oxidizes preferentially so the concentration of paramagnetic impurities, e.g., oxidized cobalt, is very low. The oxidized Co—Zr powder, which has relatively hard granules, is mixed with a soft ferromagnet Such as body centered cubic Fe. The powder mixture is compacted by pressing, rolling or extruding to form a compacted mixture that exhibits GMR at room temperature. Other mechanically soft magnetic alloys can be substituted for the body centered cubic Fe, Such as Ni80Fe20 (i.e., Permalloy) and Fe—Si transformer core material.

The Co in Co—Zr alloy can be substituted by Fe or Ni, or the Zr—Co alloy may be substituted by a combination of Co—Zr, Ni—Zr and Fe—Zr alloys. Alternatively, the Zr in the Co—Zr alloy may be replaced by Ti, Hf, Ta, Sc or Y. The resulting alloys form thin insulating oxide coating of $TiO_2$, $HfO_2$, $Ta_2O_5$, $Sc_2O_3$ and $Y_2O_3$, respectively, each of which provides a suitable tunneling barrier.

Another metallic alloy that forms a thin insulating oxide coating and can therefore be used as a powder to form the magnetoresistive material of the device according to the present invention is Ni—Al, where the Al content is in the range of 1 to 10 atomic percent. The higher Al content alloys form the best oxide, nearly pure $Al_2O_3$, but the lower Al content have the higher saturation magnetization. Among the ferromagnetic transition metals, high saturation alloys usually have more highly spin polarized conduction electrons and thus give larger tunneling magnetoresistance.

It is contemplated that the powder with the tunneling barrier coating can be combined with another metallic ferromagnetic material by means other than mixing and pressing two powders. The powder with the tunneling barrier coating can be distributed on a suitable substrate and the other magnetic phase can be deposited on the powder by electroplating (on a conductive substrate), electroless deposition on an insulating substrate, chemical vapor deposition or physical vapor deposition.

EXAMPLE

Narrowly dispersed $CrO_2$ of the grade used for coating magnetic recording media, as obtained from DuPont E I De Nemours & Company, a Ni powder obtained from Praxair, Inc. were prepared by simple hand mixing in a ratio of 25 volume % of $CrO_2$ and 75 volume % Ni. The powder mixture was then pressed in a hydraulic press at a pressure of 263,000 Lb/in$^2$ into pellet-shaped samples. When observed under a scanning electron microscope, the $CrO_2$ granules of the sample had oblong shapes with a mean length of approximately 0.5 $\mu$m and a mean maximum diameter of approximately 0.1 $\mu$m, and the Ni granules had a more regular shape with a mean dimension of 45 $\mu$m.

Figure 3B:
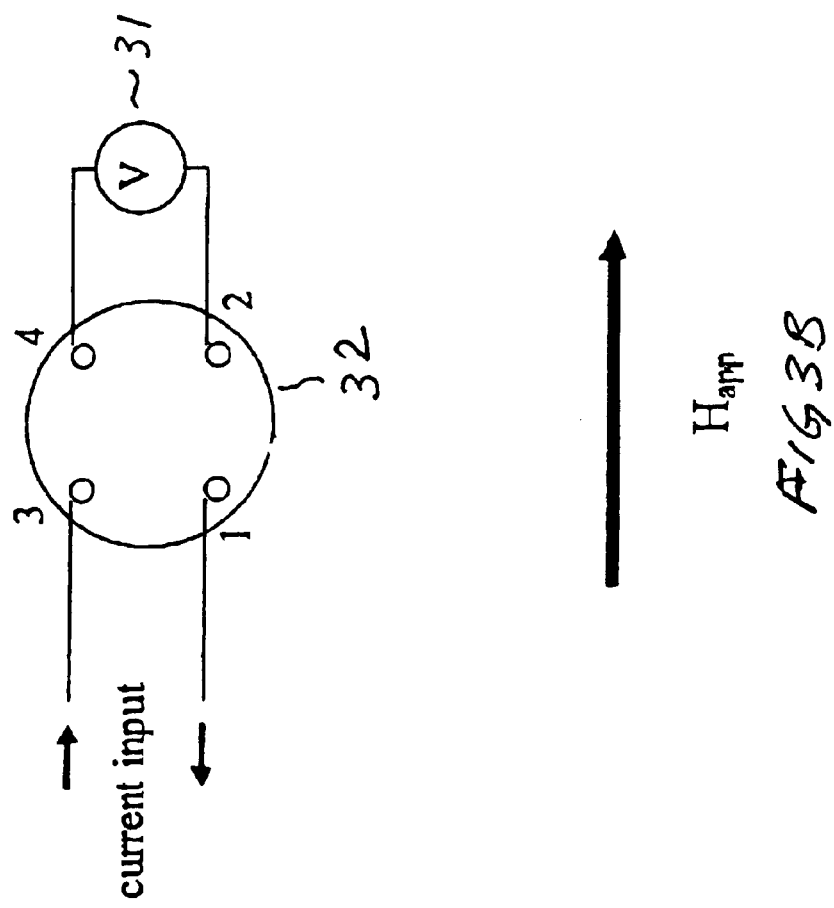
FIG. 3b is a schematic illustration of the four point probe arrangement for measuring sample resistance as a function of the applied magnetic field, $H_{app}$, used to obtain the data shown in FIG. 2, the direction of $H_{app}$ being substantially perpendicular to the direction of current flow in the sample.
Figure 3A:
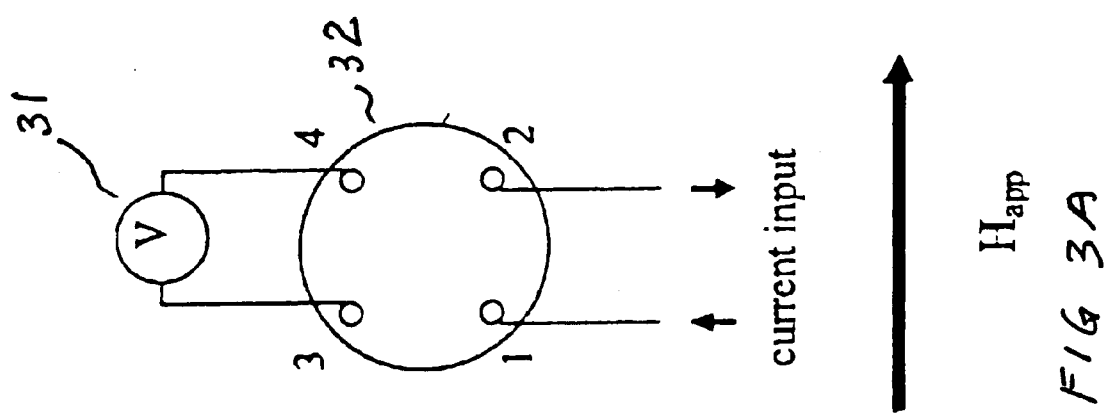
FIG. 3a is a schematic diagram of a four point probe arrangement for measuring sample resistance as a function of the magnitude of the applied magnetic field, $H_{app}$, for obtaining the data shown in FIG. 1, the direction of the $H_{app}$ being substantially parallel to the direction of current flow in the sample.

A sample was immersed in a magnetic field, $H_{app}$, and the magnetoresistance of the material was measured using, a four point probe arrangement as illustrated in FIGS. 3A and 3B. Referring, to FIG. 3A, metallic probes 1, 2, 3 and 4 were placed in contact with a flat portion of the pellet shaped sample 32 in the presence of an applied magnetic field, $H_{app}$. A conventional current source (not shown) was connected to probes 1 and 2 to provide a current input to the sample 32, and a conventional voltmeter 31 was connected to probes 3 and 4 to measure the voltage drop produced by the current input. In the arrangement illustrated in FIG. 3A, the direction of current flow through the sample 32 was substantially parallel to that of the applied magnetic field, $H_{app}$. The resistance of the sample 32 was calculated by dividing the measured voltage by the value of the current input, which was set at 0.1 mA. The resistance thus obtained for different values of the magnitude of the applied magnetic field, $H_{app}$, is represented graphically in FIG. 1.

FIG. 3B shows the arrangement for measuring the magnetoresistance of the sample 32 for the case where the current flow through the sample is substantially perpendicular to the direction of the applied magnetic field, $H_{app}$. As shown in the figure, the current source (not shown) was connected to probes 1 and 3 and the voltmeter 31 was connected to probes 2 and 4. The sample resistance was again obtained by dividing the measured voltage by the value of the current input, which was set at 0.1 mA. The values of the sample resistance thus obtained for different values of the magnitude of the applied magnetic field, $H_{app}$, are represented graphically in FIG. 2.

Figure 2:
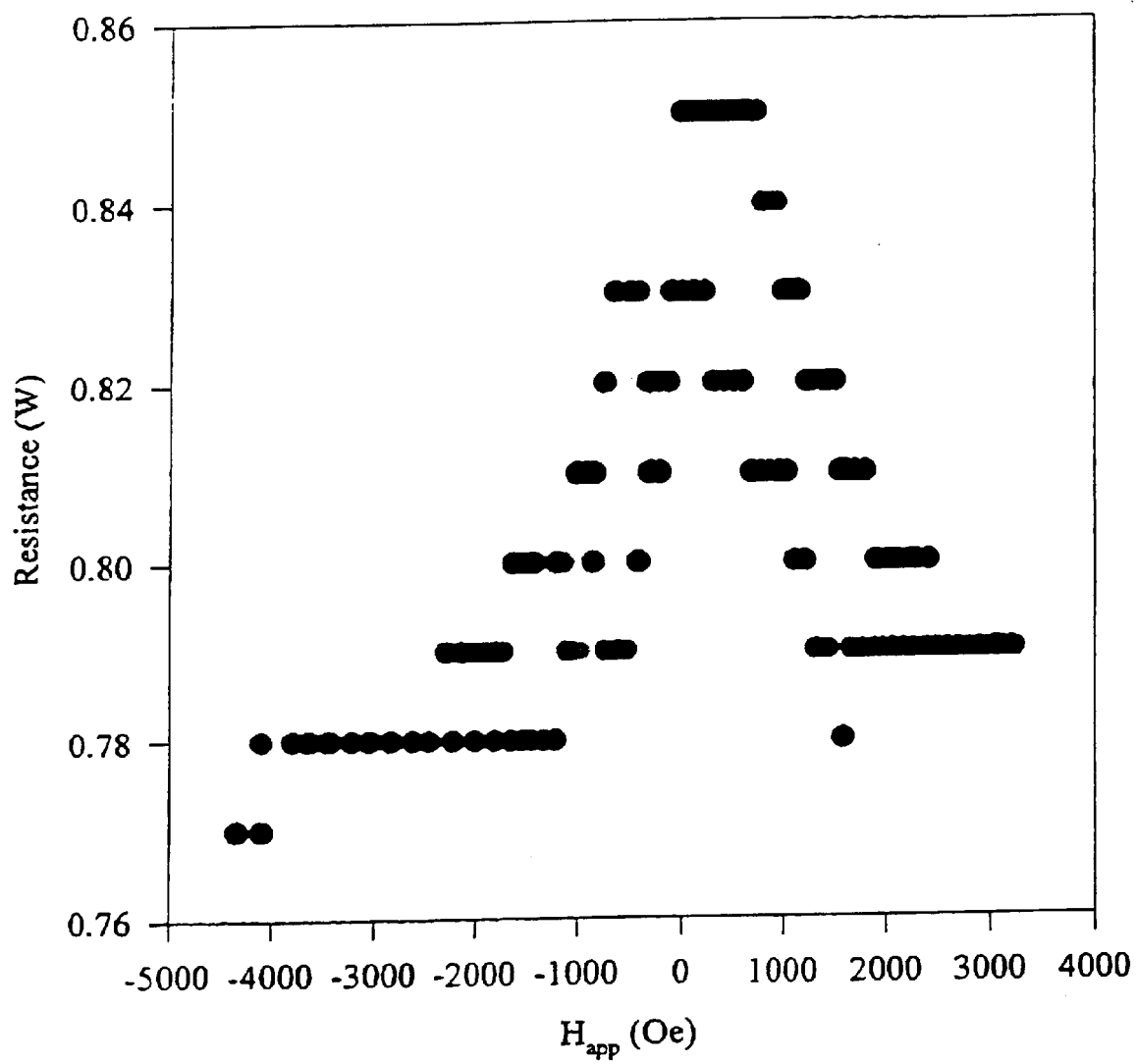
FIG. 2 is a graph of the sample resistance versus the applied magnetic field, $H_{app}$, for a sample Current of 0.1 mA, where the applied field is substantially perpendicular to the direction of current flow in the sample made in accordance with the exemplary embodiment of the present invention.

It may be seen from the sample resistance data shown in FIGS. 1 and 2 that the magnetoresistance ratio was approximately 12%, when the direction of current flow was substantially parallel to the direction of the applied magnetic field, $H_{app}$, and the magnetoresistance ratio was approximately 8% when the direction of current flow was substantially perpendicular to the direction of the applied magnetic field, $H_{app}$.

Advantageously, the Ni and $CrO_2$ mixture is compressed at pressures in the range of 100,000 to 400,000 $Lb/in^2$. It was found that for pressures greater than 400,000 $Lb/in^2$ the magnetoresistance ratio decreases, and for pressures less than 100,000 $Lb/in^2$ the compacted material lacked mechanical stability.

While the present invention has been particularly described with reference to the preferred embodiments, it will be understood by those skilled in the art that various modifications and alterations may be made without departing from the spirit and scope of the invention. Accordingly, the disclosed invention is to be considered merely illustrative and limited in scope only as specified in the appended claims.

What is claimed is:

1. A device comprising a magnetoresistive material including a first metallic ferromagnetic powder material having granules at least partially coated with a thin insulating material and a second metallic ferromagnetic material in contact with the granules of the first metallic ferromagnetic powder material, the first ferromagnetic powder material having a higher coercive field than the second metallic ferromagnetic material.

2. The device of claim 1, wherein the granules of the first metallic ferromagnetic powder material are relatively hard and the second metallic ferromagnetic material is a powder having relatively soft granules, the first and second metallic ferromagnetic powder materials being mixed and compressed to form a compacted material.

3. The device of claim 2, wherein the first metallic ferromagnetic powder material comprises granules of $CrO_2$ at least partially coated with a tunnel barrier layer of $Cr_2O_3$, and the second metallic ferromagnetic powder material comprises granules of Ni.

4. The article of claim 3, wherein the compacted material comprises approximately 25 volume % $CrO_2$ and approximately 75 volume % Ni.

5. The device of claim 3, wherein the granules of $CrO_2$ have a major dimension no greater than 1 μm, and the granules of Ni have a major dimension no greater than 45 μm.

6. The device of claim 3, wherein the compacted material is formed by applying a pressure in the range of 100,000 to 400,000 $Lb/in^2$ to the mixture of $CrO_2$ and Ni powders.

7. The device of claim 3, wherein the magnetoresistance ratio of the compacted material is at least 8% at a temperature of 300° K in a magnetic field of approximately 4000 Oe applied in a direction substantially perpendicular to the direction of current flow in the material.

8. The device of claim 3, wherein the magnetoresistance ratio of the compacted material is at least 12% at a temperature of 300° K in a magnetic field of approximately 4000 Oe applied in a direction substantially parallel to the direction of current flow in the material.

9. The device of claim 1, wherein the first metallic ferromagnetic powder material comprises granules of Co—Zr alloy at least partially coated with a tunnel barrier layer of $ZrO_2$.

10. The device of claim 1, wherein the first metallic ferromagnetic powder material comprises granules of X—Zr alloy at least partially coated with $ZrO_2$, where X is selected from the group consisting of Fe and Ni.

11. The device of claim 1, wherein the first metallic ferromagnetic powder material comprises granules of Co—A alloy, where A is selected from the group consisting of Ti, Hf, Ta, Sc and Y, and the granules of Co—A alloy is at least partially coated with a material selected from the group consisting of $TiO_2$, $HfO_2$, $Ta_2O_5$, $Sc_2O_3$ and $Y_2O_3$.

12. The device of claim 1, wherein the second metallic ferromagnetic material is selected from the group consisting of body centered cubic Fe, Ni80Fe20 and Fe—Si transformer core material.

13. The device of claim 1, wherein the first metallic ferromagnetic powder material comprises granules of Ni—Al alloy at least partially coated with a tunnel barrier layer of $Al_2O_3$.

14. The device of claim 13, wherein Al content of the Ni—Al granules is in the range of 1 to 10 atomic percent.

15. A method for making a device comprising a magnetoresistive material including the steps of mixing a first metallic ferromagnetic powder material having relatively hard granules at least partially coated with a tunnel barrier layer of an insulating material and a second metallic ferromagnetic powder material having relatively soft granules, the granules of the first ferromagnetic powder material having a higher coercive field than the granules of the second ferromagnetic material, and compressing the mixture of the first and second metallic ferromagnetic powder materials to form a compacted material.

16. The method of claim 15, wherein the step of compressing the mixture of the first and second metallic ferromagnetic powder materials includes pressing the mixture in a hydraulic press.

17. The method of claim 15, wherein the step of compressing the mixture of the first and second metallic ferromagnetic powder materials includes the step of rolling the mixture.

18. The method of claim 15, wherein the step of compressing the mixture of the first and second metallic ferromagnetic powder materials includes the step of extruding the mixture.

19. The method of claim 15, wherein the first metallic ferromagnetic power material comprises granules of $CrO_2$ at least partially coated with a tunnel barrier layer of $Cr_2O_3$ and the second metallic ferromagnetic powder material comprises granules of Ni.

20. The method of claim 19, wherein the mixture of the first and second metallic ferromagnetic powder materials being compressed comprises approximately 25 volume % of $CrO_2$ and approximately 75 volume % Ni.

21. The method of claim 19, wherein the granules of $CrO_2$ have a major dimension no greater than 1 μm and granules of Ni have a major dimension no greater than 45 μm.

22. The method of claim 19, wherein the mixture of the first and second metallic ferromagnetic powder materials is compressed at a pressure in the range of 100,000 to 400,000 $Lb/in^2$.

23. The method of claim 19, wherein the magnetoresistance ratio of the compacted material is at least 8% at a temperature of 300° K in a magnetic field of approximately 4000 Oe applied substantially perpendicular to the direction of current flow in the compacted mixture.

24. The method of claim 19, wherein the magnetoresistance ratio of the compacted material is at least 12% at a temperature of 300° K in a magnetic field of approximately 4000 Oe applied in a direction substantially parallel to the direction of current flow in the compacted mixture.

25. The method of claim 15, wherein the first metallic ferromagnetic powdered material comprises granules of Co—Zr alloy at least partially coated with a tunnel barrier layer of $ZrO_2$.

26. The method of claim 15, wherein the first metallic ferromagnetic powder material comprises granules of X—Zr alloy at least partially coated with a thin layer of $ZrO_2$, where X is selected from the group consisting of Fe and Ni.

27. The method of claim 15, wherein the first metallic ferromagnetic powder material comprises granules of Co—A alloy where A is selected from the group consisting of Ti, Hf, Ta, Sc and Y.

28. The method of claim 15, wherein the first metallic ferromagnetic powder material comprises granules of Ni—Al alloy at least partially coated with a thin layer of $Al_2O_3$.

29. The method of claim 28, wherein the content of Al in the Ni—Al alloy is in the range of 1 to 10 atomic percent.

30. The method according to claim 15, wherein the second metallic ferromagnetic powder material comprises granules of a material selected from the group consisting of body centered cubic Fe, Ni80Fe20 and Fe—Si transformer core material.

31. A method for fabricating a device comprising a magnetoresistant material including the steps of distributing on a substrate a first metallic ferromagnetic powder material having granules at least partially coated with a tunnel barrier layer of insulating material, and depositing of a layer of a second metallic ferromagnetic material over the granules on the substrate, the first metallic ferromagnetic powder material having a higher coercive field than the second metallic ferromagnetic material.

32. The method of claim 31, wherein the substrate is a conducting material and the step of depositing the layer of the second metallic ferromagnetic material includes the step of electroplating the granules of the first metallic ferromagnetic powder material on the substrate with the second metallic ferromagnetic material.

33. The method of claim 31, wherein the substrate is a nonconducting material and the step of depositing a layer of the second metallic ferromagnetic material includes the step of electroless plating the first metallic ferromagnetic powder material on the substrate with the second metallic ferromagnetic material.

34. The method of claim 31, wherein the step of depositing a layer of the second metallic ferromagnetic material includes the step of chemical vapor deposition of the second metallic ferromagnetic material on the first metallic ferromagnetic powder material on the substrate.

35. The method of claim 31, wherein the step of depositing a layer of the second metallic ferromagnetic material includes the step of physical vapor deposition of the second metallic ferromagnetic material on the first metallic ferromagnetic powder material on the substrate.

* * * * *

UNITED STATES PATENT AND TRADEMARK OFFICE
CERTIFICATE OF CORRECTION

PATENT NO. : 6,361,863 B1
DATED : March 26, 2002
INVENTOR(S) : Gambino et al.

It is certified that error appears in the above-identified patent and that said Letters Patent is hereby corrected as shown below:

Title page,
Item [56], References Cited, OTHER PUBLICATIONS, "Julliere", reference "Ferromagenetic" should read -- Ferromagnetic --

Column 3,
Line 61, "coating" should read -- coatings --

Column 4,
Line 23, "Lb/in$^2$" should read -- lb/in$^2$ --
Line 30, "using, a" should read -- using a --

Column 5,
Lines 2, 3, 5 and 43, "Lb/in$^2$" should read -- lb/in$^2$ --
Line 17, "thin" should read -- tunnel barrier layer of an --
Line 19, "the granules" should read -- the at least partially coated granules --
Line 65, "is" should read -- are --

Column 6,
Line 3, "body centered" should read -- body-centered --
Line 35, "Cr$_2$ O$_3$" should read -- Cr$_2$O$_3$ --
Line 48, "Lb/in$^2$" should read -- lb/in$^2$ --

Column 7,
Line 12, "body" should read -- body- --

Signed and Sealed this

Sixteenth Day of March, 2004

JON W. DUDAS
*Acting Director of the United States Patent and Trademark Office*